United States Patent
Voldman et al.

[11] Patent Number: 5,930,098
[45] Date of Patent: *Jul. 27, 1999

[54] MULTICHIP SEMICONDUCTOR STRUCTURES WITH INTERCHIP ELECTROSTATIC DISCHARGE PROTECTION, AND FABRICATION METHODS THEREFORE

[75] Inventors: Steven Howard Voldman; Paul Evans Bakeman, Jr., both of Burlington, Vt.

[73] Assignee: International Business Machines Corporation, Armonk, N.Y.

[ * ] Notice: This patent is subject to a terminal disclaimer.

[21] Appl. No.: 08/889,256

[22] Filed: Jul. 10, 1997

Related U.S. Application Data

[63] Continuation of application No. 08/392,461, Feb. 22, 1995, Pat. No. 5,703,747.

[51] Int. Cl.$^6$ ................................................ H02H 3/22
[52] U.S. Cl. .............................. 361/111; 361/56; 361/735
[58] Field of Search ................................ 361/56, 91, 111, 361/212, 220, 717, 735, 799; 257/686

[56] References Cited

U.S. PATENT DOCUMENTS

| | | | |
|---|---|---|---|
| 4,139,935 | 2/1979 | Bertin et al. | 29/571 |
| 4,198,696 | 4/1980 | Bertin et al. | 365/175 |
| 4,456,800 | 6/1984 | Holland | 200/5 A |
| 4,608,592 | 8/1986 | Miyamoto | 357/80 |
| 4,677,520 | 6/1987 | Price | 361/220 |
| 4,727,410 | 2/1988 | Higgins, III | 357/74 |
| 4,894,706 | 1/1990 | Sato et al. | 357/72 |
| 4,937,471 | 6/1990 | Park et al. | 307/296.5 |
| 5,012,924 | 5/1991 | Murphy | 206/331 |
| 5,270,261 | 12/1993 | Bertin et al. | 437/209 |
| 5,477,082 | 12/1995 | Buckley, III et al. | 257/679 |
| 5,521,434 | 5/1996 | Cronin | 257/686 |
| 5,703,747 | 12/1997 | Voldman et al. | 361/111 |

OTHER PUBLICATIONS

"Partitioning Function and Packaging of Integrated Circuits For Physical Security of Data", IBM Technical Disclosure Bulletin, vol. 32 No. 1, pp. 46–49, (Jun. 1989).

"A Chip–On–Chip DSP/SRAM Multichip Module", Tai et al., pp. 466–473, ICEMCM '95 (1995).

"Active Silicon Chip Carrier", Bodendorf et al, IBM Technical Disclosure Bulletin, vol. 15 No. 2, pp. 656–666, (Jul. 1972).

"A "GaAs on Si" PLL Frequency Synthesizer IC using Chip on Chip Technology", Sekine et al., IEEE 1994 Custom Integrated Circuits Conference, Fujitsu Limited, 0–7803–1886–Feb. 1994, pp. 563–567, (1994).

*Primary Examiner*—Jeffrey Gaffin
*Assistant Examiner*—Sally C. Medley
*Attorney, Agent, or Firm*—Heslin & Rothenberg, P.C.

[57] ABSTRACT

Interchip and intrachip electrical discharge suppression connections or networks are disclosed for three-dimensional multichip semiconductor structures. The interchip suppression networks electrically intercouple the power planes of the semiconductor device chips in the structure. This, in combination with conventional intrachip suppression networks present on the external connects or input/output pins of the individual chips in the structure, provides complete power plane-to-power plane, external connect-to-power plane and external connect-to-external connect protection against electrical discharge events, such as an electrostatic discharge occurring during handling and testing of the structure. The interchip electrical discharge suppression networks can be placed on an end layer or end semiconductor chip of the three-dimensional multichip semiconductor structure and connect to individual chips in the structure via an edge surface metallization. Techniques for suppressing electrical discharges occurring during the fabrication of three-dimensional multichip semiconductor structure are also disclosed.

11 Claims, 6 Drawing Sheets

MULTICHIP SEMICONDUCTOR STRUCTURES WITH INTERCHIP ELECTROSTATIC DISCHARGE PROTECTION, AND FABRICATION METHODS THEREFORE

CROSS-REFERENCE TO RELATED APPLICATION

The present application compresses a continuation of application Ser. No. 08/392,461, filed Feb. 22, 1995, which application is now U.S. Pat. No. 5,703,747.

TECHNICAL FIELD

This invention relates in general to protection of integrated circuit chips within a three-dimensional multichip package, and more particularly, to an interchip suppression network for protecting such integrated circuit chips from electrostatic discharges or other potentially damaging voltage transients occurring during the fabrication or subsequent handling and testing of the three-dimensional multichip package.

BACKGROUND ART

Semiconductor structures comprising three-dimensional arrays of chips have emerged as an important packaging approach. A typical three-dimensional electronic structure consists of multiple integrated circuit chips having main planar surfaces adhesively secured together to form a monolithic structure (referred to as a "stack" or "cube"). A metallization pattern is often provided directly on one or more edge surface of the multichip stack for interconnecting the chips and for electrical connection of the stack to external circuitry. This exposed metallization pattern can include both individual electrical connects and bussed electrical connects.

Electrostatic discharge (ESD) is a phenomena know to degrade or destroy discrete electronic components. In particular, given the decreasing size of circuit features with ever improving process technology, static electricity can destroy or substantially harm many of today's integrated circuits. Triboelectric charges are produced anytime two surfaces are separated and if one or more of the surfaces is a nonconductor, then a static electric charge is produced. This is a natural phenomenon and only causes a problem if the static charge is allowed to discharge or induce a charge into the integrated circuit. Such an ESD event can occur very pervasively to a point of several thousand volts. The discharge occurs very rapidly and the usual failure or degradation is caused by the gasification of metal within the device resulting in the gasified metal becoming deposited along a trace of the discharge path.

The damage following each electrostatic discharge event may be instantly catastrophic. Often times, however, the integrated circuit does not totally fail, but rather, remains operable with a latent defect that will ultimately result in premature failure. Such events can also alter the operating characteristics of the integrated circuit, thereby resulting in unsatisfactory and often unpredictable operation. Electrostatic discharge between input/output connects of a semiconductor device chip can occur, for example, from human handling, automated circuit testing or during packaging of discrete integrated circuit chips.

DISCLOSURE OF INVENTION

It has now been discovered that during three-dimensional multichip fabrication, an ESD failure can occur chip-to-chip, for example, during side surface processing of the cube whenever a voltage potential is established between two adjacent chips. This can lead to arcing from the transfer metal pins of one chip to the substrate or transfer metal pins of the adjacent chip resulting in an electrostatic discharge event. An ESD event can also be generated during testing of a multichip semiconductor stack between the testing tool and stack metallization or an integrated circuit chip substrate within the structure, which can subsequently result in a chip-to-chip ESD event.

Most, if not all, known electrostatic discharge protection networks operate in connection with a single semiconductor device chip. However, with the present discovery that electrostatic discharge events often occur during the fabrication of three-dimensional multichip packages, there exists a genuine need for interchip electrostatic discharge protection networks operable during fabrication processing and subsequent handling of the three-dimensional multichip package. The concepts, circuits and methods presented herein address this need.

Briefly summarized, the present invention comprises in a first aspect a multichip semiconductor multichip structure having a first semiconductor device chip and a second semiconductor device chip stacked together such that a first planar main surface of the first semiconductor device chip is parallel to a second planar main surface of the second semiconductor device chip. Further, interchip electrical discharge suppression means are provided electrically coupling the first semiconductor device chip and the second semiconductor device chip for suppressing an electrical discharge occurring between the two chips.

In another aspect, the invention comprises a semiconductor structure that includes a first semiconductor device chip having a first circuit at least partially providing a first predetermined circuit function and a second semiconductor device chip electrically and mechanically coupled to the first semiconductor device chip. The second semiconductor device chip has a second circuit that at least partially provides a "transparent function" to the first semiconductor device chip. In one embodiment, the transparent function comprises an interchip electrostatic discharge protection function. Alternatively, the transparent function could comprise any function not required for normal operation of the first circuit, such as a circuit test function.

In still another aspect, the invention comprises a multichip semiconductor stack including a first semiconductor device chip and a second semiconductor device chip. The first semiconductor device chip has a first substrate, a first Vcc supply, a first Vss supply, and a first input/output connect. The first semiconductor device chip further includes a first intrachip electrostatic discharge protection circuit electrically coupled between the first input/output connect and the first Vcc supply, and between the first input/output connect and the first Vss supply. The second semiconductor device chip includes a second substrate, a second Vcc supply, a second Vss supply, and a second input/output connect. The second semiconductor device chip further has a second intrachip electrostatic discharge protection circuit electrically coupled between the second input/output connect and the second Vcc supply, and between the second input/output connect and the second Vss supply. The semiconductor device stack further comprises an interchip electrostatic discharge protection network that interconnects the first semiconductor device chip and the second semiconductor device chip such that the first Vcc supply is electrically coupled to the second Vcc supply, the first Vss supply is electrically coupled to the second Vss supply, the first Vcc supply is electrically coupled to the second Vss supply, and the first Vss supply is electrically coupled to the second Vcc supply.

As a further aspect, the present invention comprises a method for fabricating a multichip semiconductor structure that includes the steps of: forming a multichip stack by stacking together a first semiconductor device chip having a first planar main surface and a second semiconductor device chip having a second planar main surface such that the first planar main surface is substantially parallel to the second planar main surface; metallizing a first edge surface of the multichip stack such that a substrate of the first semiconductor device chip is electrically connected to a substrate of the second semiconductor device chip; and subsequent thereto, forming a metallization pattern on a second edge surface of the semiconductor structure, the conductive pattern including at least one external connect of the first semiconductor device chip and at least one external connect of the second semiconductor device chip.

To summarize, presented herein are multichip semiconductor structures having interchip electrical discharge protection networks that protect against electrostatic discharges or other potentially damaging voltage transients occurring during the fabrication or subsequent handling and testing of the three-dimensional multichip package. Interchip electrical discharge suppression means electrically couple the power planes of the semiconductor device chips in the stack. This, in combination with intrachip electrical discharge suppression networks that couple the external connects of each semiconductor chip to the chip's power planes, establishes the electrical couplings needed to suppress an electrical discharge event occurring between the transfer wirings of any two semiconductor device chips in the multichip semiconductor structure.

With both interchip and intrachip suppression networks in accordance with the present invention, supply plane-to-supply plane, external connect-to-supply plane, and external connect-to-external connect electrical discharge events occurring between semiconductor device chips in a multichip stack can be suppressed. The suppression networks are bidirectional to suppress either positive or negative electrical discharge events, however, symmetry is not required.

Placement of the suppression networks on an end chip or end layer in the semiconductor stack allows for certain fabrication advantages as described herein. Further, a generalized suppression network chip, or a specifically designed suppression network chip, could be employed as the end chip in the stack. Any suppression network can be used that allows current flow between the edge surface buses in either a positive or a negative direction. In addition to providing ESD protection between the chips during handling and subsequent testing, an approach for protecting the chips immediately subsequent to assembly of the stack is presented. In all embodiments, the present invention is independent of the particular type of integrated circuit chips contained within the multichip semiconductor stack.

BRIEF DESCRIPTION OF DRAWINGS

These and other objects, advantages and features of the present invention will be more readily understood from the following detailed description of certain preferred embodiments of the invention, when considered in conjunction with the accompanying drawings in which.

BEST MODE FOR CARRYING OUT THE INVENTION

Figure 1:
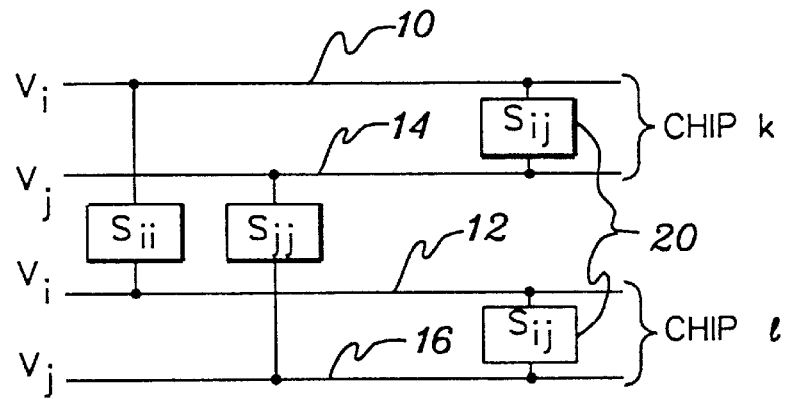
FIG. 1 is a simplified schematic representation of a multichip semiconductor structure with interchip electrical discharge suppression networks in accordance with the present invention coupling like power planes.

Described herein are various multichip semiconductor structures, generally referred to in the art as multichip "stacks" or "cubes", that include interchip electrical discharge suppression connections or networks in accordance with the present invention. Although principally intended for suppression of electrostatic discharge (ESD) events occurring between semiconductor device chips in a multichip stack, the disclosed electrical discharge suppression means could suppress any electrical discharge event occurring between chips in a stack, i.e., assuming that the event is within the design parameters of the interchip suppression means. The term "chips" could include non-semiconductor type structures, such as a heat sink structure or a ground/support structure, as well as conventional semiconductor device structures.

Both interchip and conventional intrachip suppression networks are employed pursuant to the present invention. In particular, the semiconductor device stack is provided with interchip electrically discharge suppression networks that electrically intercouple the power planes of the semiconductor device chips in the stack. Further, each semiconductor device chip is provided with an intrachip electrical discharge suppression network coupling its external connects and power planes (supplying, e.g., voltage Vcc and ground Vss). Thus, the external connects of each semiconductor device chip are electrically coupled through the chip's intrachip suppression network to its power planes, and from these power planes to the power planes of other semiconductor device chips in the multichip stack via the interchip electrical discharge suppression networks.

With both interchip and intrachip suppression networks as presented herein, supply plane-to-supply plane, external connect-to-supply plane, and external connect-to-external connect ESD events between semiconductor device chips in a multichip stack can be suppressed. From the following discussion and the known art, one of ordinary skill in the art can readily construct the interchip and intrachip electrical suppression networks required to achieve a desired interchip electrical discharge suppression specification.

The structures and methods in accordance with the present invention are described in greater detail below with reference to FIGS. 1–14, wherein the same or similar reference characters are used throughout the multiple figures to designate the same or similar components. In FIGS. 1–6 both interchip and intrachip electrical discharge suppression networks in accordance with the invention are shown. In these figures, chip "k" and chip "l" are assumed to comprise any two semiconductor device chips in a multichip stack. The stack is assumed to have two or more semiconductor device chips. Also, there is no requirement that the semiconductor device chips comprise adjacent chips in the stack, nor are the particular integrated circuits contained within the chips important, i.e., with the exception of the suppression networks described herein.

In FIG. 1, a first power plane 10 of chip "k" is shown electrically coupled to a second power plane 12 of chip "l" via an interchip electrical discharge suppression network, designated "$S_{ii}$". Power planes 10 & 12 supply the same voltage $V_i$ to the respective semiconductor device chip "k" & "l". As an example, voltage $V_i$ may comprise chip voltage Vcc. A third power plane 14 on chip "k" is electrically coupled to a fourth power plane 16 on chip "l" via a second interchip electrical discharge suppression network "$S_{jj}$". As with suppression network $S_{ii}$, the power planes 14 & 16 electrically coupled by network $S_{jj}$ comprise like voltage supplies, in this case designated $V_j$. By way of example, voltage $V_j$ may comprise ground potential Vss for the semiconductor device chips.

In addition to interchip discharge suppression networks $S_{ii}$ & $S_{jj}$, intrachip electrical discharge suppression networks 20 are shown. Each intrachip suppression network, labeled "$S_{ij}$", is electrically connected between the respective chip's power planes, i.e., suppression network 20 of chip "k" is coupled between power planes 10 and 14, while network 20 of chip "l" is electrically coupled between power planes 12 & 16. Each intrachip network 20 can comprise any conventional intrachip ESD suppression network, many of which exist in the art, such as a dual diode circuit or modification thereof.

FIG. 2 again depicts power planes 10 & 14 of chip "k" and power planes 12 & 16 of chip "l" electrically interconnected by interchip electrical suppression networks. However, these suppression networks, labeled "$S_{ij}$" and "$S_{ji}$", couple dissimilar power supply planes, i.e., plane 10 of chip "k" supplying voltage $V_i$ is electrically coupled to plane 16 of chip "l" supplying voltage $V_j$, while power plane 14 of chip "k" supplying voltage $V_j$ is electrically coupled to plane 12 of chip "l" supplying voltage $V_i$. With suppression networks $S_{ii}$, $S_{jj}$, $S_{ij}$ & $S_{ji}$ of FIGS. 1 & 2, full interchip ESD suppression coupling is achieved between the designated power planes such that an interchip ESD event occurring between any two of these supply planes (in either direction) can be suppressed. In this regard, it is significant to note that the various suppression networks employed herein are assumed to be bidirectional for suppression of a positive or negative electrical discharge event.

Figure 2:
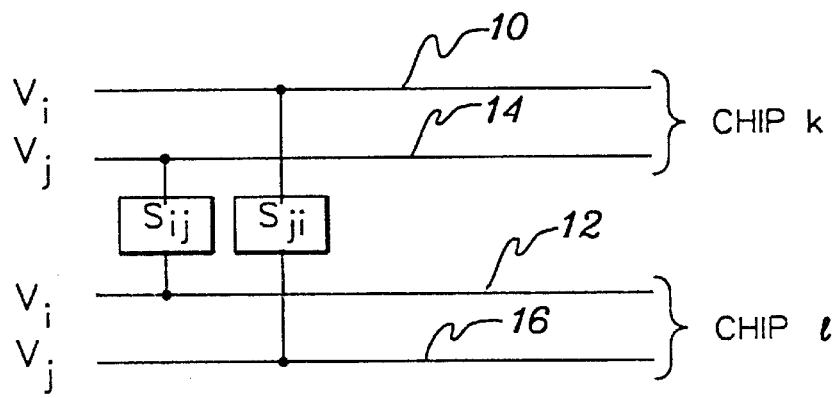
FIG. 2 is a schematic of a multichip semiconductor structure with interchip electrical discharge suppression networks in accordance with the present invention coupling dissimilar power planes.
Figure 3:
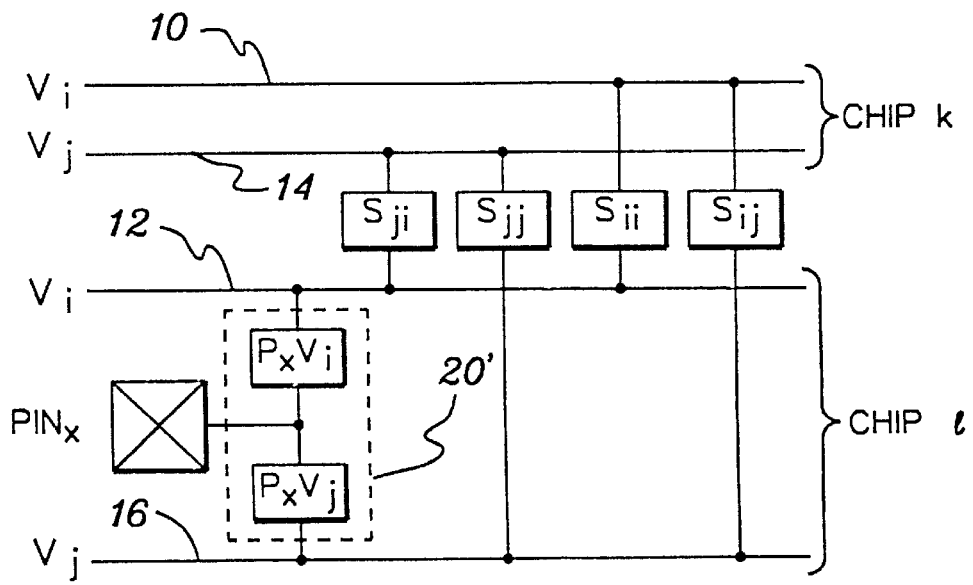
FIG. 3 is a schematic of a multichip semiconductor structure with interchip and intrachip electrical discharge protection networks in accordance with the present invention.

FIG. 3 depicts the interchip suppression networks $S_{ii}$, $S_{jj}$, $S_{ij}$ & $S_{ji}$ described with reference to FIGS. 1 & 2, along with a more detailed embodiment of intrachip suppression network 20, labeled herein 20', shown coupled between second power plane 12 and fourth power plane 16 of chip "l". This suppression network electrically connects an external connect pin, designated $PIN_x$, to power plane 12 via a first circuit $P_xV_i$ of the network and to power plane 16 via a second circuit $P_xV_j$ of the network.

As an example, intrachip suppression networks 20, 20' may comprise a conventional dual diode ESD suppression network wherein a first diode ($P_xV_i$) connects external connect PINX to voltage supply $V_i$ and a second diode ($P_xV_j$) connects external connect $PIN_x$ to voltage $V_j$. As an alternative to a simple dual diode network, any desired intrachip ESD suppression network known in the art, many of which are variations of the dual diode approach, could be employed. For example, reference commonly assigned, copending U.S. patent application Ser. No. 08/363,135, entitled "Electrostatic Discharge Suppression Circuit for Integrated Circuit Chips."

Figure 4:
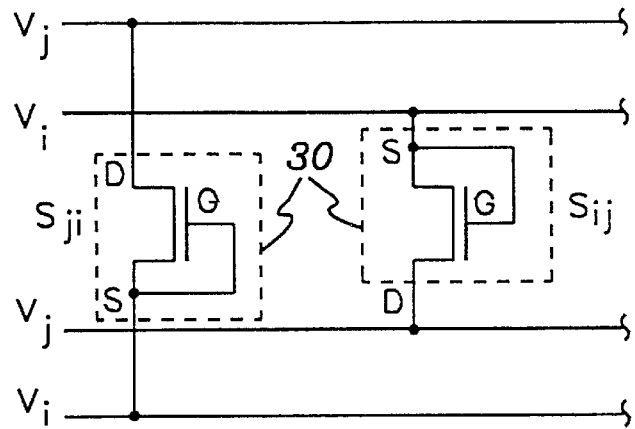
FIG. 4 is a schematic of one embodiment of an electrical discharge suppression network for coupling dissimilar power planes as in FIGS. 2 & 3.

Further, one of ordinary skill in the art can select appropriate interchip suppression networks for coupling like supply planes 10 & 12 and 14 & 16, and for coupling dissimilar supply planes 10 & 16 and 14 & 12. For example, the suppression networks coupling similar supply planes may comprise diodes, resistors, or in the case of connection between like power planes supplying voltage Vss, an electrical short. As shown in FIG. 4, the interchip suppression networks $S_{ij}$ and $S_{ji}$ coupling dissimilar supply planes may comprise metal-oxide-silicon field-effect transistors (MOSFETs) 30. In this example, each MOSFET 30 comprises an n-channel field-effect transistor having its gate "G" and source "S" tied together to maintain an "off" mode. When such devices approach an "overvoltage condition," a low current state referred to as NFET "snapback" is entered, which results in dissipation of an ESD event occurring across the planes connected to the transistor device. Numerous modifications to these suppression networks are possible. For example, MOSFETS 30 may comprise thick oxide or thin oxide field-effect transistors. If thin oxide transistors are employed, then a resistance may be connected in series therewith. As a further example, suppression networks 30 could comprise a silicon-controlled rectifier based device.

Figure 5:
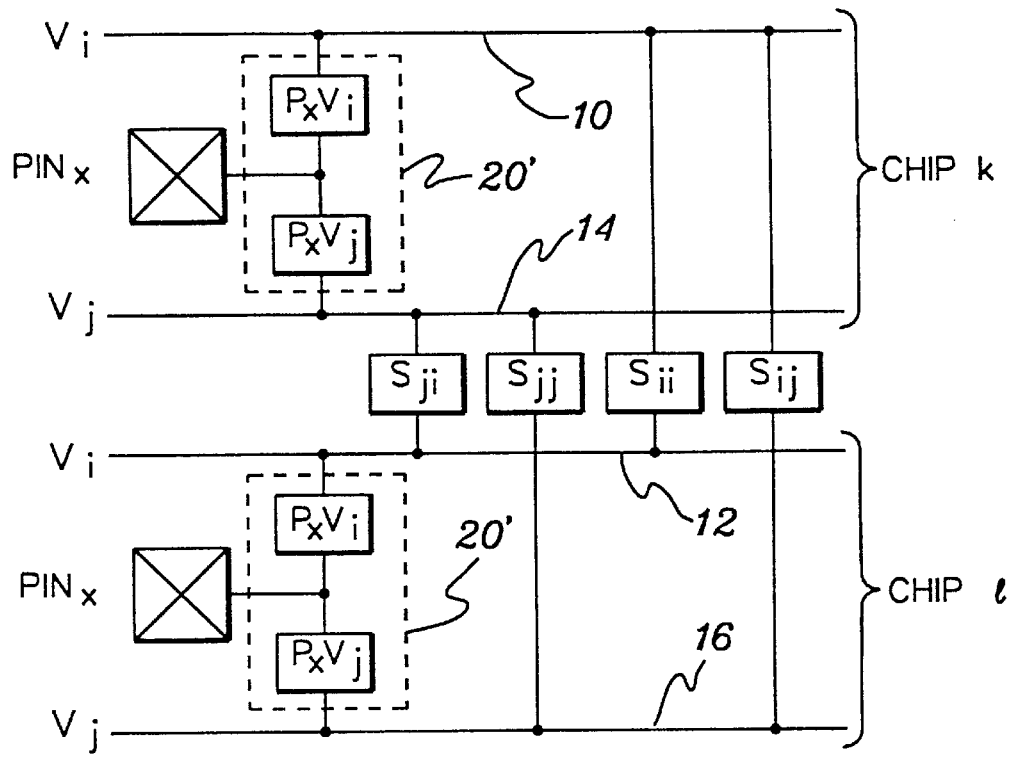
FIG. 5 is a schematic of a multichip semiconductor structure having interchip and intrachip electrical discharge suppression networks in accordance with the present invention for suppression of an interchip electrical discharge event between like input/output connects.

In FIG. 5, identical intrachip suppression networks 20' are depicted coupling external connect PIN$_X$ of chip "k" to first power plane 10 and third power plane 14 and external connect PIN$_x$ of chip "l" to second power plane 12 and fourth power plane 16. The external connects of this figure are assumed to comprise the same type input/output wire out from the respective chips "k" & "l". For example, PIN$_x$ might comprise one address pin or control pin in two identical dynamic random access memory chips "k" & "l". Note that complete ESD suppression protection is provided on the wire outs by the interchip and intrachip suppression networks of FIG. 5, i.e., supply-to-supply, PIN$_x$-to-supply and PIN$_x$-to-PIN$_x$ of semiconductor device chips "k" and "l". One assumption in this discussion is that the supply planes (i.e., power planes) are exposed at an edge surface of the multichip stack, along with the external connects, e.g., PIN$_x$. This is discussed further herein.

Figure 6:
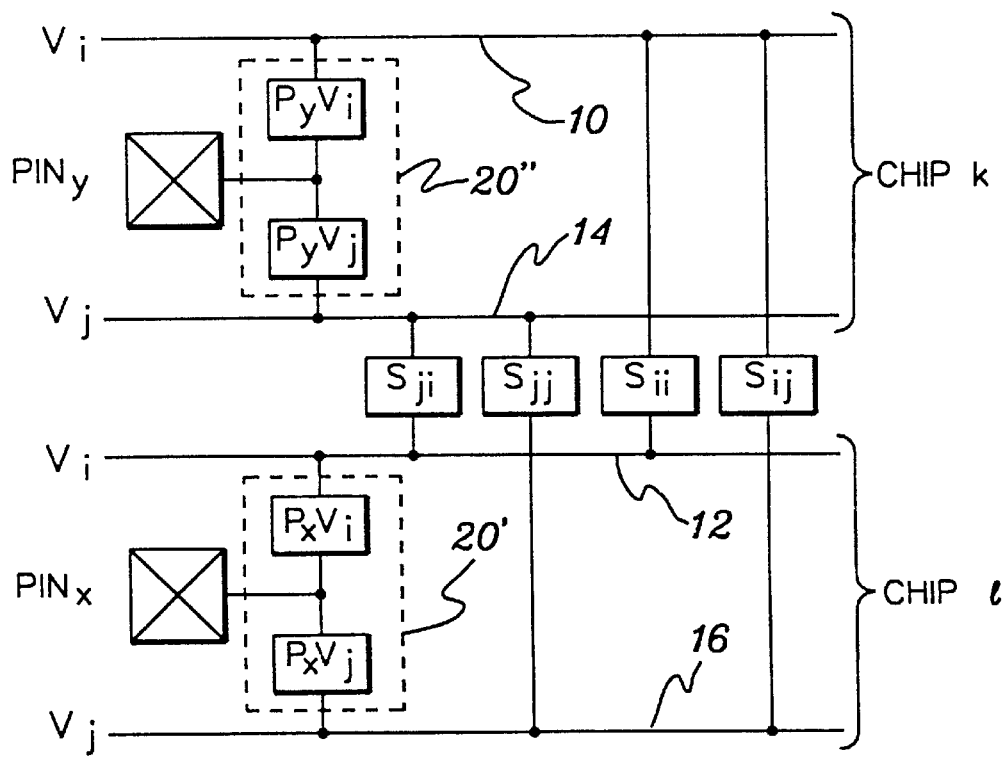
FIG. 6 is a schematic of a multichip semiconductor structure having interchip and intrachip electrical discharge suppression networks in accordance with the present invention for suppression of an interchip electrical discharge event between unlike input/output connects.

FIG. 6, which is similar to FIG. 5, depicts intrachip suppression networks 20' and 20". These networks facilitate suppression of an electrostatic discharge event occurring between dissimilar external connects, labeled PIN$_y$ and PIN$_x$. Depending upon the external connect involved, network 20" may or may not be constructed the same as intrachip suppression network 20'. External connect PIN$_y$ is shown coupled to first power plane 10 via a first circuit P$_y$V$_i$ of network 20" and to third power plane 14 via a second circuit P$_y$V$_j$ of network 20". Note that complete ESD suppression protection is provided by the interchip and intrachip suppression networks of FIG. 6 from supply-to-supply, PIN$_y$-to-supply, PIN$_x$-to-supply, and PIN$_y$-to-PIN$_x$ of semiconductor device chips "k" and "l".

Figure 7:
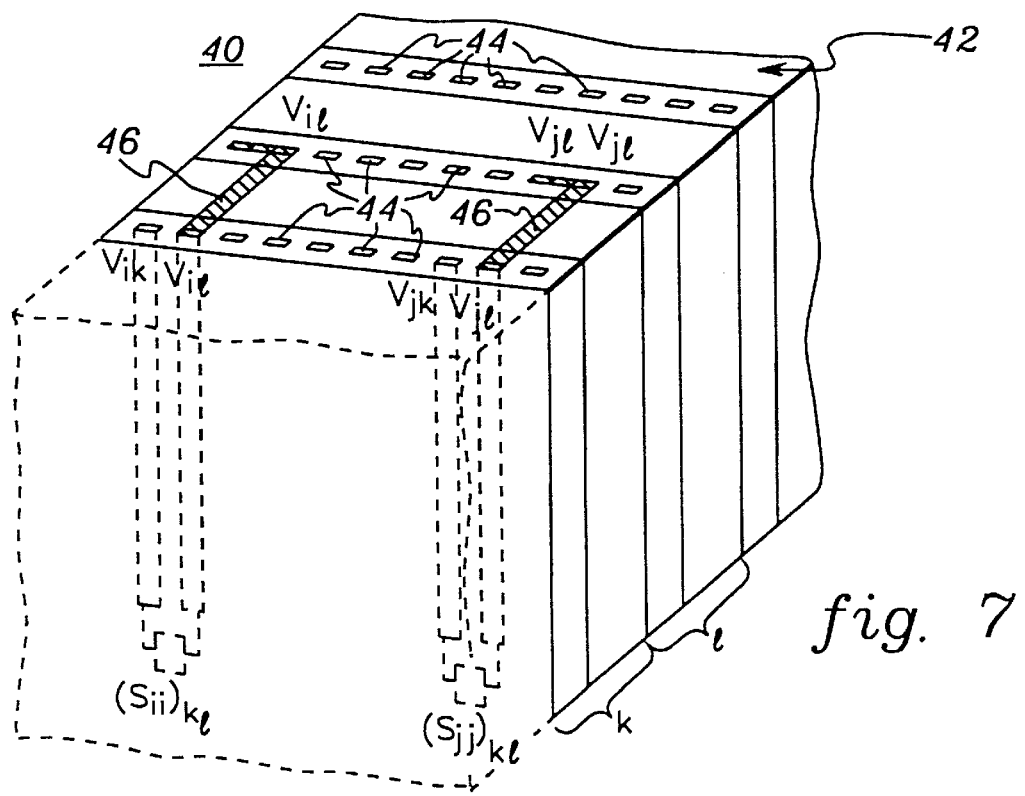
FIG. 7 is a partial perspective view of a multichip semiconductor structure having interchip electrical discharge suppression circuitry in accordance with the present invention.

In certain multichip stack designs, an edge surface thereof contains one or more electrical buses which interconnect multiple external connects and/or power planes of multiple chips in the stack. For example, FIG. 7 depicts a multichip stack, generally denoted 40, having an edge surface 42 defined by the common edges of multiple semiconductor device chips in the stack. Transfer wirings from the individual chips are exposed as external connects 44. Buses 46 are shown electrically connecting designated external connects on semiconductor device chip "l" with selected connects of semiconductor device chip "k". Because of this edge surface metallization, the interchip suppression networks coupling semiconductor device chips "k" & "l" in the stack can reside on either one of the chips, or both of the chips. As an example, interchip suppression networks S$_{ij}$ and S$_{jj}$ can reside on semiconductor device chip "k" or, alternatively, the networks could reside on chip "l" or be disbursed between semiconductor device chip "k" and semiconductor device chip "l".

Figure 8:
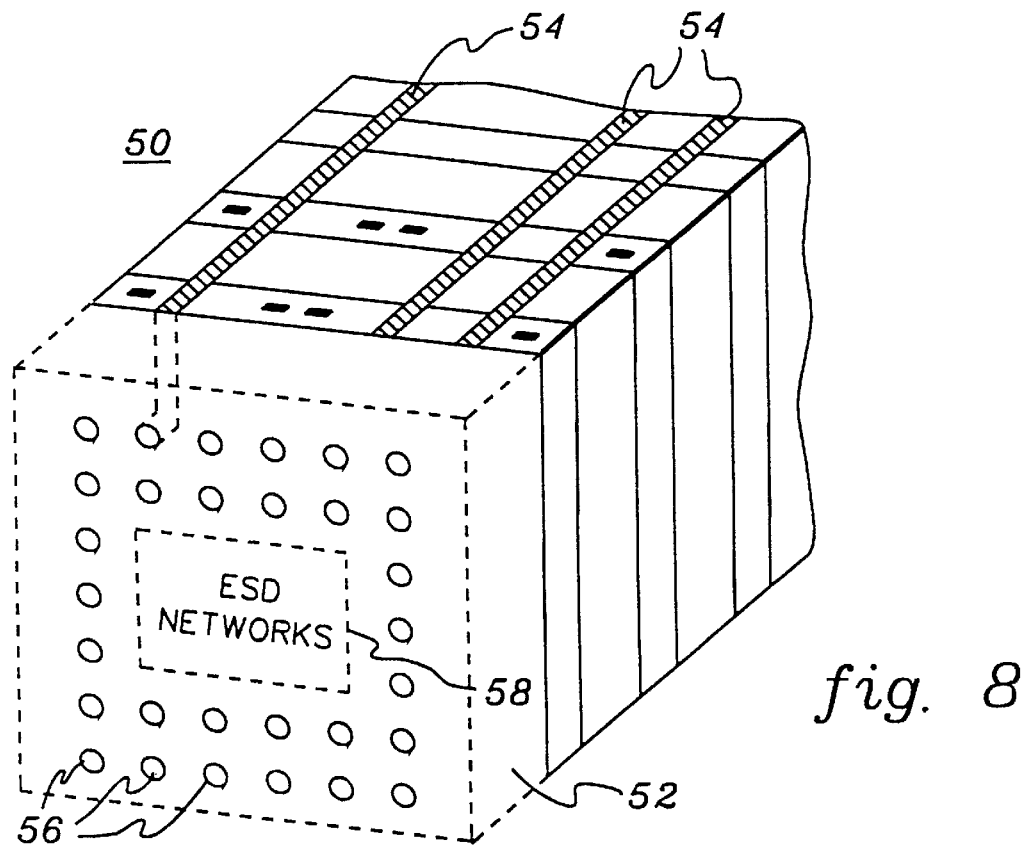
FIG. 8 is a partial perspective view of a multichip semiconductor structure having interchip electrostatic discharge (ESD) networks in accordance with the present invention disposed at an end layer of the multichip semiconductor stack.

Another significant feature of the present invention is the ability to place the interchip suppression networks at an end layer or end semiconductor device chip 52 of a multichip stack 50 (see FIG. 8). As shown, multiple edge surface metallizations or buses 54 are often brought to end layer 52 for connection to designated contact pads 56 disposed thereon. (Various techniques for electrically connecting an edge surface bus 54 to an end surface contact pad 56 exist in the art, for example, reference commonly assigned, co-pending application Ser. No. 08/000,826, entitled "Multichip Integrated Circuit Packages and Systems.")

Interchip ESD networks can advantageously be implemented on the end layer in the stack using a number of different approaches. For example, a silicon end chip could be constructed for merging with the multichip stack as a wire out surface substantially as shown in FIG. 8. The end chip, fabricated from silicon using existing technology, can include the desired ESD protection circuits 58 as described herein. These ESD networks would be wired to buses 54 in order to achieve bus-to-bus electrostatic discharge protection. The buses may comprise power rails or external connect rails for multiple chips in the stack.

Another alternative would be to construct a generalized end semiconductor device chip containing a range of different types of electrical discharge suppression networks for use with a variety of different multichip semiconductor stacks. Such a chip could be customized by a fabricator for use within a particular multichip stack. For example, suppression networks for CMOS, BiCMOS, NMOS, PMOS or other applications could all be fabricated within a single generalized end chip. The metal levels would then be personalized to wire up specific ESD networks depending upon stack requirements.

In still another embodiment, the end semiconductor device chip could comprise a "dead" or otherwise unused chip that contains conventional intrachip electrostatic discharge suppression circuits. These intrachip suppression circuits could be converted by one of ordinary skill in the art to function as the interchip suppression circuits described herein by rewiring the electrical connections thereto.

Figure 9:
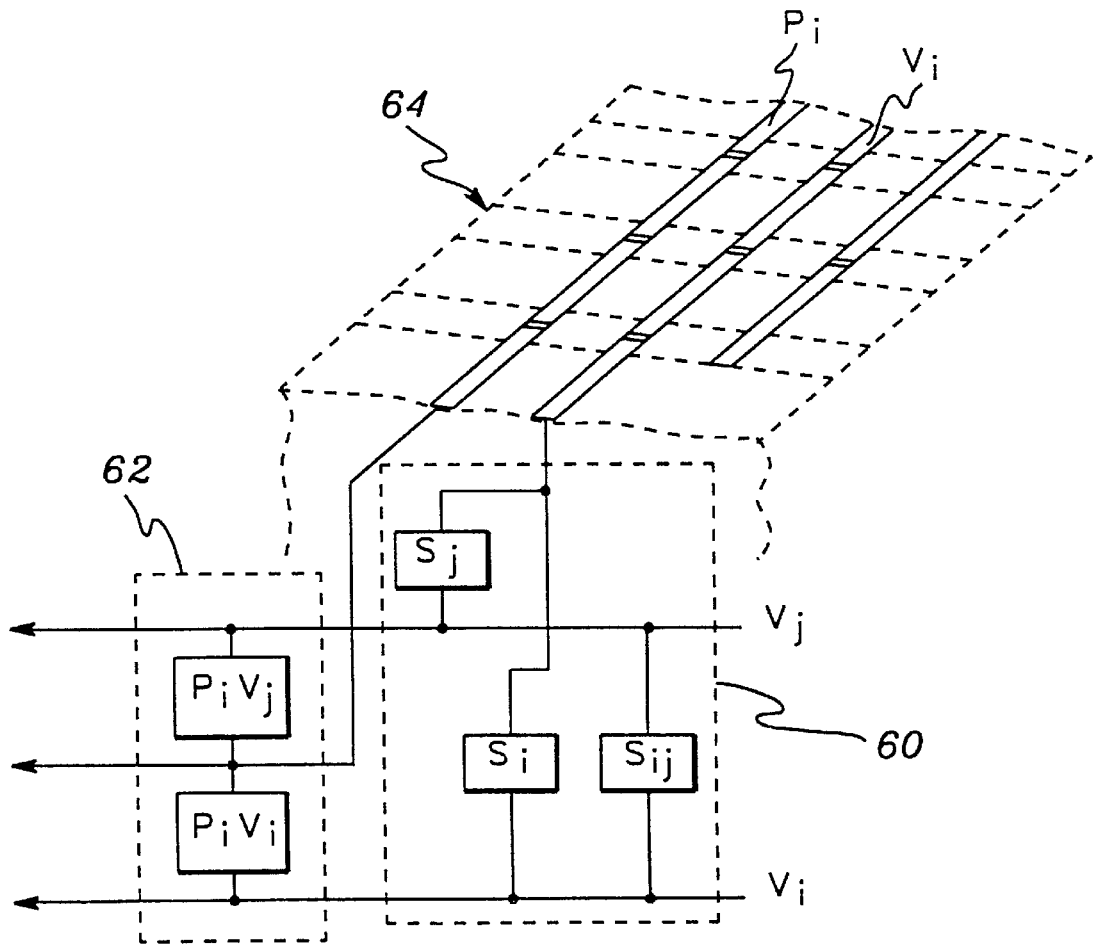
FIG. 9 is a schematic of one portion of the interchip ESD networks of FIG. 8 shown connected to a pin-type edge surface interconnect bus and a supply-type edge surface interconnect bus.

FIG. 9 depicts a first suppression network 60 and a second suppression network 62 of an end layer or chip for a multichip stack 64. As shown, stack 64 includes a first bus interconnecting external connect pins P$_i$ and a second bus interconnecting power plane connects V$_i$. Network 60 comprises an ESD suppression network that couples like power planes V$_i$ (brought to the edge surface of stack 64 via appropriate transfer wirings) to power plane supplies V$_j$ and V$_i$ provided on an end surface of the multichip semiconductor stack. Each suppression circuit S$_j$, S$_i$, & S$_{ij}$ within suppression network 60 is assumed to comprise an appropriate bidirectional ESD suppression circuit, as described above in connection with FIGS. 1–6.

Similarly, suppression network 62 preferably resides at an end layer or chip of the multichip semiconductor stack. This network couples the first bus to power plane supply V$_j$ via a first circuit P$_i$V$_j$ and to power plane supply V$_i$ via a second circuit P$_i$V$_i$. Thus, for those external connects P$_i$ and power planes V$_i$ electrically connected by the first bus and the second bus, respectively, common ESD suppression networks may be provided within the stack.

As noted initially, an electrostatic discharge event can occur during the fabrication of a multichip semiconductor stack, and in particular, prior to formation of a metallization pattern on an edge surface thereof. Once multiple semiconductor device chips have been assembled into a stack configuration, an edge surface is typically polished down to expose transfer wirings from the individual chips. It has been discovered that during this process a voltage potential can sometimes occur between semiconductor device chips in the stack. If this happens, charge is stored between the two chips which can lead to arcing, for example, from a transfer metal pin of one chip to the substrate of an adjacent chip. This electrostatic discharge event is in the nature of a charge machine model where a capacitor is discharged through a low resistance shunt. The arc effective discharge resistance is approximately 1–10 ohms, which is sufficient to cause failures within the semiconductor device chips. Described below is another aspect of the present invention specifically directed to solving this problem.

Figure 10:
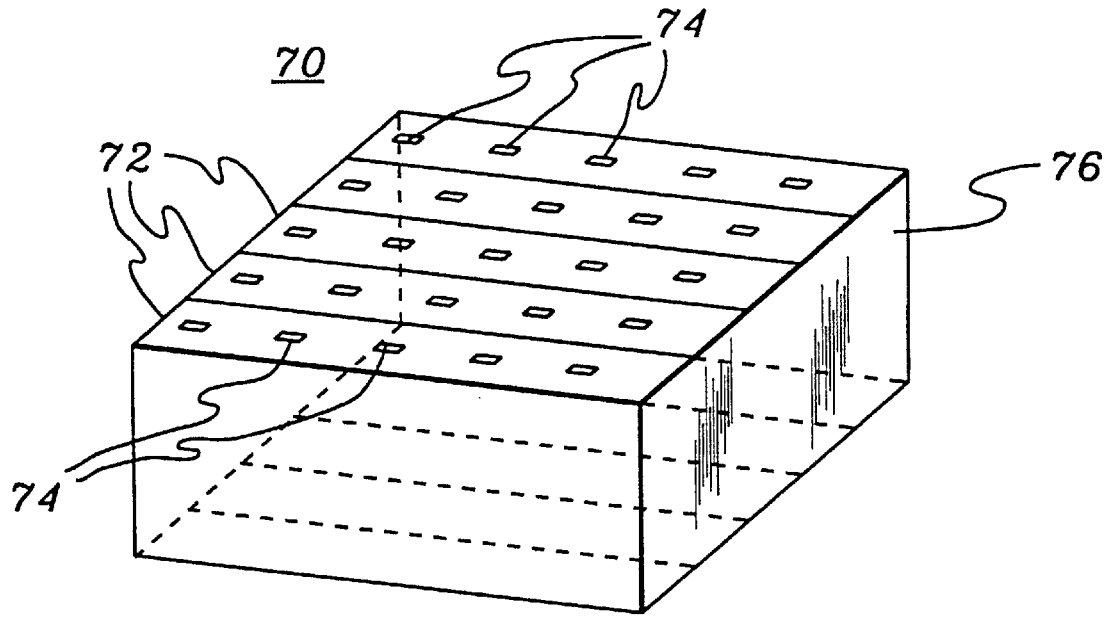
FIG. 10 is a perspective view of a multichip semiconductor structure having an edge surface conductor interconnecting chip substrates in accordance with one aspect of the present invention.

FIG. 10 depicts a semiconductor device structure 70 comprising multiple semiconductor device chips 72 laminated together in a stack or cube configuration. Multiple electrical connects 74 or transfer wirings are exposed on an edge surface of stack 70. At least one other edge of stack 70 is provided with a conductive material 76 electrically coupling the substrates of chips 72. Various approaches to accomplishing this structure and function are possible.

For example, the stack edge to receive material 76 could be mechanically polished smooth to expose the chip substrates, after which the stack could undergo standard-.semiconductor processing to form a highly conductive metal layer thereon, comprising, e.g., aluminum, copper, silver or a conductive polymer such as polyaniline. If desired, such a layer could be formed on all stack edge surfaces not containing transfer wirings. Again, the function of conductive material 76 is to electrically connect the silicon substrates of the various semiconductor device chips 72 within stack 70. As an alternate approach, the electrically conductive layer could be painted onto one or more stack edge surface using a conductive paint, or metal buses could be formed thereon electrically connecting the different substrates of the multiple chips in the stack.

Figure 11:
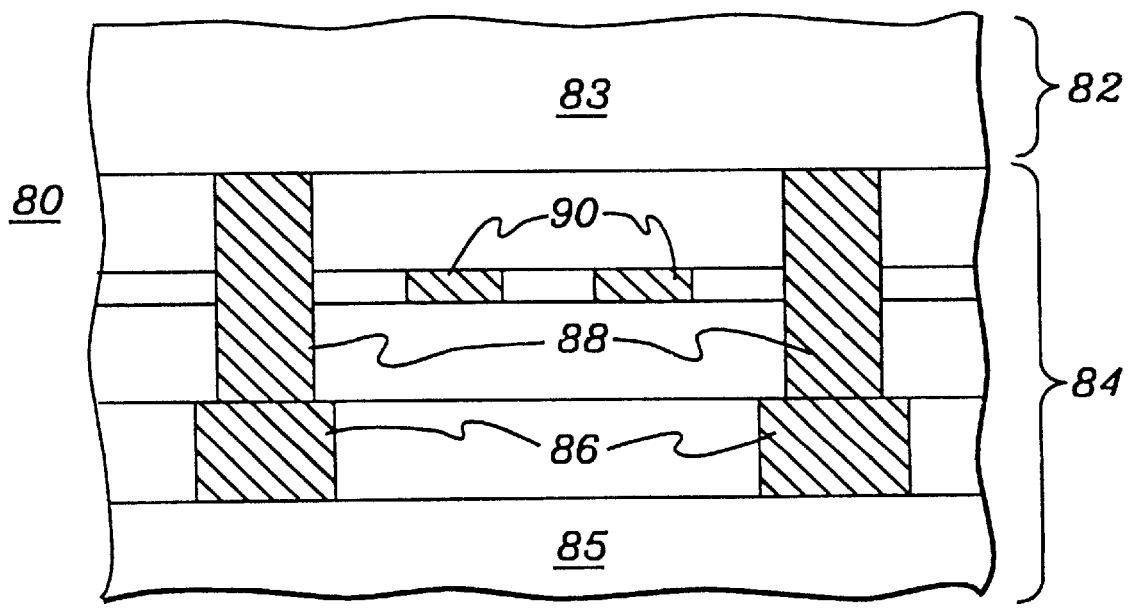
FIG. 11 is a partial elevational view of two adjacent semiconductor device chips in a multichip semiconductor structure having direct electrical interconnect between chip substrates in accordance with the present invention.

A further approach to accomplishing electrical interconnection of the chip substrates is depicted in FIG. 11, wherein two adjacent semiconductor device chips 82 & 84 of a multichip semiconductor stack 80 are partially shown. Electrical connection of a substrate 83 of chip 82 to a substrate 85 of chip 84 is achieved via a conventional substrate ring 86 and the provision of metal studs 88 disposed between substrate 83 and substrate ring 86. Transfer metal wirings 90 are also shown as a reference. Note that this "internal connection" approach reserves the edge surfaces of the stack for possible multiple edge surface wire out. The structure of FIG. 11 can be fabricated by etching, prior to stack assembly, multiple throughholes down to the substrate ring 86. These throughholes could be formed, for example, at the four corners of the semiconductor device chip. Thereafter, aluminum could be chemical vapor deposited (CVD) and etched off the upper surface of the chip so that when the stack is assembled, the metallized throughholes electrically short the substrate of the adjacent semiconductor device chip to the chip's substrate ring.

Figure 12:
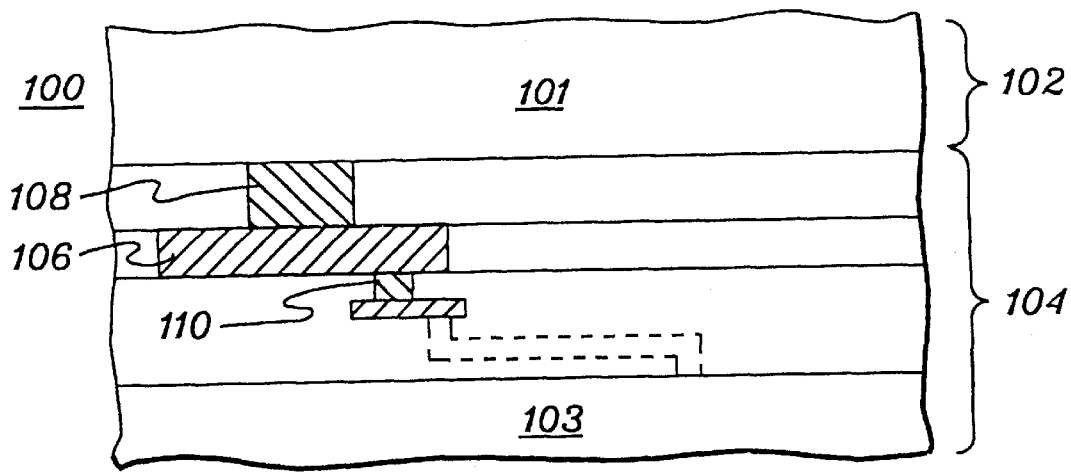
FIG. 12 is a partial perspective view of two adjacent semiconductor device chips in a multichip semiconductor structure with indirect electrical interconnect between chip substrates in accordance with the present invention.

Another approach to electrically connecting substrates is depicted in FIG. 12, wherein two adjacent semiconductor device chips 102 and 104 of a multichip semiconductor stack 100 are partially shown. In this embodiment, a substrate 101 of chip 102 is electrically connected to a substrate 103 of chip 104 via a metallized throughhole 108 connection down to the ground power plane Vss 106 of chip 104. Power plane 106 is assumed to be electrically connected by standard metal levels 110 to substrate 103. Note that this approach, and the approach presented in FIG. 11, are only applicable for establishing a short between ground planes or substrates of adjacent semiconductor device chips.

Figure 13:
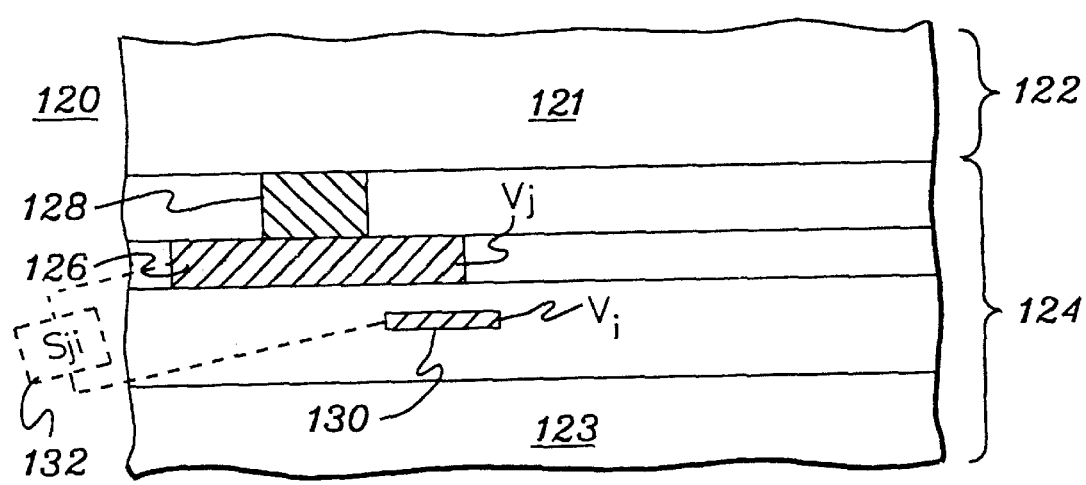
FIG. 13 is a partial elevational view of two adjacent semiconductor device chips in a multichip semiconductor structure pursuant to the present invention wherein an interchip suppression network is electrically coupled between a first power plane and a second power plane of a first semiconductor device chip, with the first power plane electrically connected to the substrate of the second semiconductor device chip.

FIG. 13 depicts one approach to establishing an electrical coupling of two adjacent chips via a suppression network. This figure shows a portion of a substrate 121 of a first semiconductor device chip 122 electrically connected to a power plane 126 supplying voltage $V_j$ to an adjacent semiconductor device chip 124 in a multichip semiconductor stack 120. Power plane 126, which is assumed to be supplying voltage Vss is electrically connected via a metal throughhole 128 to substrate 121 of chip 122. Semiconductor device chip 124 also includes above its substrate 123 a second power plane 130, which supplies voltage $V_i$. Interconnecting power planes 126 and 130 is an electrical discharge suppression network 132, shown in phantom. As noted above, network 132 could be disposed anywhere within multichip semiconductor stack 120. For example, network 132 could reside within chip 124 or within an end layer or end semiconductor device chip (not shown).

Figure 14:
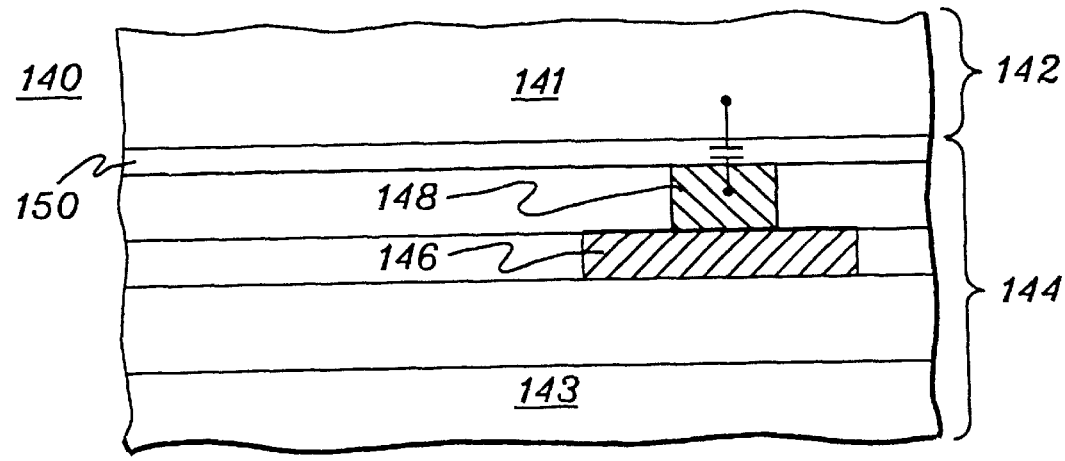
FIG. 14 is a partial elevational view of two adjacent semiconductor device chips in a multichip semiconductor structure pursuant to the present invention wherein a sacrificial capacitor is disposed at the interface between the semiconductor device chips.

Another approach to forming an ESD protection circuit within a semiconductor device stack 140 is depicted in FIG. 14. In this embodiment, a substrate 141 of a first semiconductor device chip 142 is capacitively coupled to a power plane 146 above a substrate 143 of an adjacent semiconductor device chip 144 in the stack 140. A metal throughhole 148 is disposed between power plane 146 and a thin polyimide layer 150 upon which substrate 141 resides. In this arrangement, layer 150 defines a sacrificial capacitor between semiconductor device chip 142 and chip 144 which will short upon the occurrence of electrical discharge event therebetween.

To summarize, presented herein are various multichip semiconductor structures having interchip electrical discharge protection networks that protect against electrostatic discharges or other potentially damaging voltage transients occurring during the fabrication or subsequent handling of a three-dimensional multichip package. Interchip electrical discharge suppression networks electrically couple the power planes of the semiconductor device chips in the stack. This, in combination with intrachip electrical discharge suppression networks that couple the external connects of each semiconductor chip to the chip's power planes, establishes the electrical interconnections needed to suppress an electrical discharge event occurring between the electrical connects of any two semiconductor device chips in the multichip semiconductor structure.

In particular, with both interchip and intrachip suppression networks in accordance with the present invention, supply plane-to-supply plane, external connect-to-supply plane, and external connect-to-external connect electrical discharge events occurring between semiconductor device chips in a multichip stack can be suppressed. The suppression networks are bidirectional to suppress either positive or negative electrical discharge events, however, symmetry is not required.

Placement of the suppression networks on an end chip or end layer in the semiconductor stack is preferred and provides certain fabrication advantages as described herein. Further, a generalized suppression network chip, or a specifically designed suppression network chip, could be employed as the end chip in the stack. Any suppression network could be used within the end chip that allows current flow between the edge surface buses in either a positive or a negative direction. In addition to providing ESD protection between the chips during handling and subsequent testing, an approach for protecting the chips immediately subsequent to formation of the stack is set forth.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

We claim:

1. A multichip semiconductor stack, said stack comprising:

a first at least partially bare semiconductor device chip having a first circuit at least partially providing a first predetermined circuit function; and a second at least partially bare semiconductor device chip electrically and mechanically coupled to said first semiconductor device chip, said second semiconductor device chip of said stack having a second circuit at least partially providing a transparent function to said first circuit of said first bare semiconductor device chip of said stack, said second circuit comprising at least one of an active or passive electronic component.

2. The multichip semiconductor stack of claim 1, wherein said transparent function provided by said second semiconductor device chip to said first semiconductor device chip comprises an interchip electrostatic discharge protection function.

3. The multichip semiconductor stack of claim 1, wherein said first semiconductor device chip and said second semiconductor device chip comprise adjacent chips within the multichip semiconductor stack such that a planar main surface of the first semiconductor device chip is parallel to a planar main surface of the second semiconductor device chip, and wherein a metal interconnect electrically couples a substrate of said first semiconductor device chip to a substrate of said second semiconductor device chip, thereby preventing an electrical discharge therebetween.

4. The multichip semiconductor stack of claim 3, wherein said metal interconnect comprises a metallization on at least one edge surface of the multichip semiconductor stack, said metallization comprising one of a metallic film, a conductive polymer, and a metallic paint.

5. The multichip semiconductor stack of claim 1, wherein said at least one of an active or passive electronic component of said second circuit comprises at least one of a metal-oxide-silicon field-effect transistor (MOSFET), a silicon controlled rectifier (SCR), a diode, a capacitor, or a resistor.

6. The multichip semiconductor stack of claim 1, wherein said second circuit comprises an active circuit, said active circuit including said at least one of an active or passive electronic component.

7. The multichip semiconductor stack of claim 1, wherein said transparent function provided by said second circuit to said first circuit comprises a circuit test function.

8. A multichip semiconductor stack, said stack comprising:

a first semiconductor device chip having a first circuit at least partially providing a first predetermined circuit function, said first semiconductor device chip including a first planar main surface; and a second semiconductor device chip electrically and mechanically coupled to said first semiconductor device chip, said second semiconductor device chip having a second planar main surface, said first semiconductor device chip and said second semiconductor device chip being stacked together such that said first planar main surface of said first chip is parallel to said second planar main surface of said second semiconductor device chip, said second semiconductor device chip of said stack having a second circuit at least partially providing a transparent function to said first circuit of said first semiconductor device chip of said stack, and said transparent function of said second circuit being provided by at least one of an active electronic component or a passive electronic component.

9. The multichip semiconductor stack of claim 8, wherein said at least one of said active electronic component or passive electronic component of said second circuit comprises at least one of a metal-oxide-silicon field-effect transistor (MOSFET), a silicon controlled rectifier (SCR), a diode, a capacitor, or a resistor.

10. The multichip semiconductor stack of claim 8, wherein said second circuit comprises an active circuit, said active circuit including said at least one of said active or passive electronic component.

11. The multichip semiconductor stack of claim 8, wherein said transparent function provided by said second circuit to said first circuit comprises a circuit test function.

* * * * *

UNITED STATES PATENT AND TRADEMARK OFFICE
CERTIFICATE OF CORRECTION

PATENT NO. : 5,930,098
DATED : July 27, 1999
INVENTOR(S) : Voldman et al.

It is certified that error appears in the above-identified patent and that said Letters Patent is hereby corrected as shown below:

Col. 7, line 5, delete "PINX" and replace with --$PIN_X$--.

Signed and Sealed this

Twenty-first Day of December, 1999

Attest:

Q. TODD DICKINSON

*Attesting Officer*    *Acting Commissioner of Patents and Trademarks*